(12) United States Patent
Arp et al.

(10) Patent No.: US 10,263,606 B2
(45) Date of Patent: Apr. 16, 2019

(54) ON-CHIP WAVEFORM MEASUREMENT

(71) Applicant: INTERNATIONAL BUSINESS MACHINES CORPORATION, Armonk, NY (US)

(72) Inventors: Andreas Arp, Nufringen (DE); Fatih Cilek, Boeblingen (DE); Michael V. Koch, Ehningen (DE); Matthias Ringe, Tuebingen (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/792,819

(22) Filed: Oct. 25, 2017

(65) Prior Publication Data
US 2018/0219539 A1 Aug. 2, 2018

Related U.S. Application Data

(63) Continuation of application No. 15/420,191, filed on Jan. 31, 2017.

(51) Int. Cl.
H03M 1/10 (2006.01)
H03K 5/04 (2006.01)
H03K 5/26 (2006.01)
G04F 10/00 (2006.01)
G01R 25/00 (2006.01)
H03K 5/00 (2006.01)

(52) U.S. Cl.
CPC .............. H03K 5/04 (2013.01); G01R 25/005 (2013.01); G04F 10/005 (2013.01); H03K 5/26 (2013.01); H03K 2005/00058 (2013.01)

(58) Field of Classification Search
CPC ........ H03K 5/04; H03K 5/26; G06F 13/1689; H03M 1/1038
USPC .......................... 341/144, 155, 120, 118, 143
See application file for complete search history.

(56) References Cited

U.S. PATENT DOCUMENTS 7,161,514 B2 * 1/2007 Tamba ................ H03M 1/1038
341/120
8,116,417 B2 * 2/2012 Choi ..................... H04L 7/0337
327/147
9,519,015 B2 12/2016 Chung-Chieh et al.
(Continued)

OTHER PUBLICATIONS

Arp, Andreas et al., "On-Chip Waveform Measurement"; U.S. Appl. No. 15/420,191, filed Jan. 31, 2017.
(Continued)

Primary Examiner — Peguy Jean Pierre
(74) Attorney, Agent, or Firm — Cantor Colburn LLP; Steven Myers

(57) ABSTRACT

A circuit for measuring a transition time of a digital signal may be provided. The circuit comprises a window detector comprising a comparator circuitry arranged for generating a first signal based on comparing said digital signal with a first reference voltage and for generating a second signal based on comparing said digital signal with a second reference voltage. Additionally, the circuit comprises a time-difference-to-digital converter operable for converting a delay between an edge of said first signal and an edge of said second signal into a digital value, said digital value characterizing said transition time of said digital signal.

2 Claims, 5 Drawing Sheets

(56) References Cited

U.S. PATENT DOCUMENTS

| | | | |
|---|---|---|---|
| 2001/0014922 A1* | 8/2001 | Kuge | G06F 13/1689 710/36 |
| 2006/0181303 A1* | 8/2006 | Dreps | G06F 13/4072 326/29 |
| 2007/0255517 A1 | 11/2007 | Boerstler et al. | |
| 2007/0262799 A1 | 11/2007 | Nagata | |
| 2010/0058104 A1* | 3/2010 | Ishikawa | G06F 1/06 713/503 |

OTHER PUBLICATIONS

List of IBM Patents or Patent Applications Treated as Related; (Appendix P), Date Filed Oct. 25, 2017; 2 pages.

* cited by examiner

ON-CHIP WAVEFORM MEASUREMENT

DOMESTIC PRIORITY

This application is a continuation of the legally related U.S. application Ser. No. 15/420,191 filed Jan. 31, 2017, which is fully incorporated herein by reference.

BACKGROUND

The invention relates generally to a circuit for measuring waveforms of digital signals, and more specifically, to a circuit measuring a transition time of a digital signal. The invention relates further to a system for measuring a transition time of a digital signal.

Designing digital circuitry requires a clear design of signal timing and the right sequence of signals dependent on each other. Special focus is often on investigating time behavior, especially, on wave forms of critical signals, like, clock signals. In particularly, rising and falling edges of signals require special attention. Displaying this time behavior of these critical signals on and in integrated circuits is paramount for the functionality and reliability of VLSI chips. Besides the signal waveform in general, the slew rate is a relevant figure of merit and has to be monitored for meeting design requirements. One of the caveats is that the measurement has to be done on-chip because of the risk of distortions from the observed signal by external measurement equipment. Therefore, an on-chip waveform measurement method and system is appropriate which is enabled to measure wave forms of periodic signals and, among others, a skew adjustment circuit.

SUMMARY

According to one aspect of the present invention, a circuit for measuring a transition time of a digital signal may be provided. The circuit may comprise a window detector comprising a comparator circuitry arranged for generating a first signal based on comparing the digital signal with a first reference voltage and for generating a second signal based on comparing the digital signal with a second reference voltage and, a time-difference-to-digital converter operable for converting a delay between an edge of the first signal and an edge of the second signal into a digital value. The digital value may characterize the transition time—in particular from one status to another—of the digital signal.

According to another aspect of the present invention, a method for measuring a transition time of a digital signal may be provided. The method may comprise choosing a rising or a falling edge of the digital signal, setting a lower programmable delay value and an upper programmable delay value to a minimum value each and defining a first reference voltage and a second reference voltage characterizing the transition time of the digital signal. Furthermore, the method may comprise determining whether a skew sensor is metastable and, on a positive outcome of the determination, save an adjusted step count of the upper and lower programmable delay value. In the case of a negative outcome of the determination, the method may comprise selecting either the upper or the lower programmable delay value to be decreased or increased, respectively, before returning to the step of determining whether the skew sensor is metastable.

BRIEF DESCRIPTION OF THE DRAWINGS

It should be noted that embodiments of the invention are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, but to which the invention is not limited. Embodiments of the invention will be described, by way of example only, and with reference to the following drawings.

DETAILED DESCRIPTION

Figure 1:
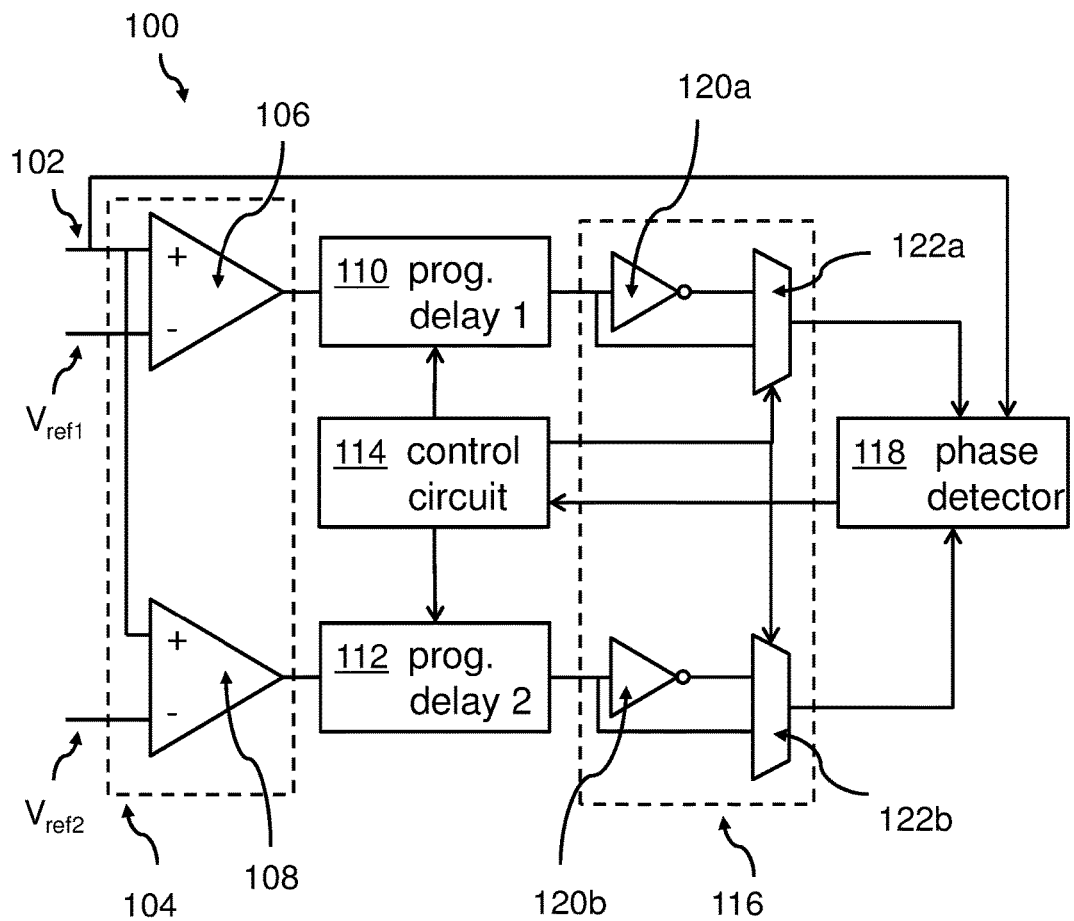
FIG. 1 shows a block diagram of an embodiment of the inventive circuit for measuring a transition time of a digital signal.

In the context of this description, the following conventions, terms and/or expressions may be used:

The term 'transition time'—in particular a transition time of a digital signal—may denote the time required for a transition of the digital signal from a 0-state to a 1-state (rising edge), or from a 1-state to a 0-state (falling edge), respectively.

The term 'window detector'—may denote a circuitry for determining whether an unknown input is between two defined reference threshold voltages. It may employ two comparators for detecting an over-voltage or an under-voltage. Each single comparator may detect a common input voltage against one of two reference voltages.

The term 'comparator circuitry' may denote a device that may compare two voltages or currents and may output a digital signal indicating which is larger. It may have two analog input terminals V+, V− V+{\displaystyle V_{+}\,} V−{\displaystyle V_{-}\,} and one binary digital output VO V o {\displaystyle V_{o}\,}. The output is ideally "1" if V+>V− and "0" if V+<V−. Typically, a comparator consists of a specialized high-differential amplifier. They are commonly used in devices that measure and digitize analog signals, such as analog-to-digital converters (ADCs), as well as relaxation oscillators.

The term 'time-difference-to-digital converter' may denote a circuitry for converting a time difference between different signals into a digital value. The time-difference-to-digital converter may comprise a plurality of individual partial circuits, like, programmable delay lines, in edge detection circuit, a phase detector, as well as specifically designed control logic coordinating the functions of the other components. The comparator circuitry may be used as a window detector.

The term 'D-flip-flop' may denote a classical RS-flip-flop for which the reset is negated to the set input. This may prevent that an undefined status is possible. The D-flip-flop is a basic element of a static read-write-memory. The storage of a bit is only controlled by the clock input. Only when the clock input is active, the input value is translated to the output value. The following table shows statuses:

| States | | Inputs |
|---|---|---|
| Previous | Present | D |
| 0 | 0 | 0 |
| 0 | 1 | 1 |
| 1 | 0 | 0 |
| 1 | 1 | 1 |

The term 'hot-1 coding'—also denoted as 'Gray code'—may denote a sequence of digital values—e.g., 4 bits—in such a way that the adjacent bit pattern do not represent significant steps from one value to the other, like, the transition from "1111" to "0000" in typical digital counting when an overflow happens. The Gray code—also known as reflected binary code (RBC)—is a binary numeral system where two successive values differ in only one bit (binary digit). The 4 bit-Gray-code may have a sequence as follows: 0000, 0001, 0011, 0010, 0110, 0111, 0101, 0100, 1100, 1101, 1111, 1110, 1010, 1011, 1001, 1000.

The proposed circuit for measuring a transition time of a digital signal may offer multiple advantages and technical effects:

Although other methods for analyzing waveforms are known, the proposed concept differs significantly from the existing methods and technologies. In general, the hardware complexity is reduced by 60% if compared to known technologies requiring low pass filters, digital-to-analog converters, and other logic control circuits. The new waveform analyzer may be implemented directly in newly designed VLSI chips so that additional sense pins for sensing analog voltage levels outside of the chip may not be required. Additionally, XOR gates, integrators, and unity gain buffers may not be required.

In the here proposed concept, the accuracy is determined by the minimal step size of a programmable delay line. In 14 nm technology, the basic delay is about 2.5 to 3 ps. As a consequence, and differentiating feature, the proposed concept delivers a higher accuracy and significant lower hardware complexity.

In the following, in additional embodiments of the circuit as well as the method will be described.

According to one embodiment of the circuit, the time-difference-to-digital converter may be operable in a rise time measurement mode for converting a delay between a rising edge of the first signal and a rising edge of the second signal to the digital value so that the transition time characterizes a rise time of the digital signal. An easy analysis of the rising edge of a digital signal—in particular, a clock signal—becomes possible.

According to a related embodiment of the circuit, the time-difference-to-digital converter may be operable in a fall time measurement mode to convert the delay between a falling edge of the first signal and a falling edge of the second signal to the digital value so that the transition time characterizes a fall time of the digital signal. Thus, additionally, an easy analysis of the falling edge of the same clock signal may also become possible.

According to one advantageous embodiment of the circuit, the time-difference-to-digital converter may comprise a first programmable delay line and/or a second programmable delay line. The time-difference-to-digital converter may comprise a phase detector, the first programmable delay line being arranged to forward the first signal to the phase detector with a first programmable delay applied and/or the second programmable delay line being arranged to forward the second signal to the phase detector with a second programmable delay applied. Thus, time-difference-to-digital converter may require some simple interlinked electronic circuits and allow the precise measurement of the waveform.

According to one additional embodiment of the circuit, the phase detector may be linked to a control circuit operable for iteratively adjusting the first and/or the second delay until a phase difference detected by the phase detector, is below a predefined threshold value and for determining the transition time from the first and/or second delay. The predefined threshold value may essentially be Zero. Thus, if the edges of two signals may be aligned, an optimized clock signal may be generated.

According to a further advantageous embodiment of the circuit, the time-difference-to-digital converter may also comprise an edge detection circuitry comprising a first multiplexer and a second multiplexer switchable by the control circuit. An output line of the first multiplexer may either be the output signal of the first programmable delay line or an inverted output signal of the first programmable delay line. An output line of the second multiplexer may either be the output signal of the second programmable delay line or an inverted output signal of the second programmable delay line. The inversion may be achievable by a simple inverter circuit. As a consequence, the required circuitries for the first programmable delay line and the second programmable delay line are symmetrical.

According to a useful embodiment of the circuit, the output of the first multiplexer may be connected to a first input line of the phase detector. The output of the second multiplexer may be connected to a second input line of the phase detector. Also here, the circuitries are symmetrical making the design straightforward.

According to one permissive embodiment of the circuit, the phase detector may comprise a first D-flip-flop whose input line may be connected to the output line of the first and second multiplexer and whose clock input line may be connected to the output line of the second multiplexer. Hence, standard non-complex circuits may be used inside the phase detector.

According to one optional embodiment of the circuit, the phase detector may comprise also a synchronizer circuitry comprising a predefined number—e.g., three—of cascaded D-flip-flops being clocked by a clock signal from the control circuit and operable for outputting a sense signal being used as input line of the control circuit. Thus, a closed loop circuitry is implemented.

According to an additional embodiment of the circuit, the first programmable delay line and/or a second programmable delay line are each organized in a hot-1 coding manner. This may guarantee that from one step to another step of the programmable delay line no extraordinary steps in the delay are possible.

According to an advantageous embodiment of the method, the determination whether the skew sensor may be metastable may have a positive outcome if a predefined percentage value of cycles has another value than a predetermined logical value. The predefined percentage value may be, e.g., 20%, meaning that two out of 10 cycles another output signal would be measured than expected.

In the following, a detailed description of the figures will be given. All instructions in the figures are schematic. Firstly, a block diagram of an embodiment of the inventive circuit for measuring a transition time of a digital signal is given. Afterward, further embodiments, as well as embodiments of the method for measuring a transition time of a digital signal, will be described.

FIG. 1 shows a block diagram of an embodiment of the inventive circuit 100 for measuring a transition time of a digital signal. The digital signal 102 from the device under test (DUT)—e.g., a clock signal—may be inputted to the window detector 104. The window detector may comprise two comparators 106, 108. The incoming digital signal 102 is connected with the input terminals V+ of the two comparators 106, 108. The input V− of comparator 106 is connected to a first reference voltage Vref1, and the input V− of comparator 108 is connected to a second reference voltage Vref2. The output lines of comparators 106 and 108 are connected to a time-difference-to-digital converter. The time-difference-to-digital converter comprises to programmable delay lines 110, 112, a control circuit 114, an edge detector 116 and, a phase detector 118.

The edge detection circuitry 116 comprises two symmetrical partial circuits comprising each an inverter 120a, 120b and a multiplexer 122a, 122b. The selected input of the multiplexers is controlled by the control circuit 114. The control circuit 114 itself is controlled by an output of the phase detector 118. The control circuit 114 delivers input to the first programmable delay line 110 and the second programmable delay line 112. Basically, these inputs to the programmable delay lines are 4-bit values determining the delay of the programmable delay lines.

It may also be noted that the digital input signal 102 of the device under test—which typically generates the clock signals to be optimized—is fed into the phase detector 118.

Figure 2A:
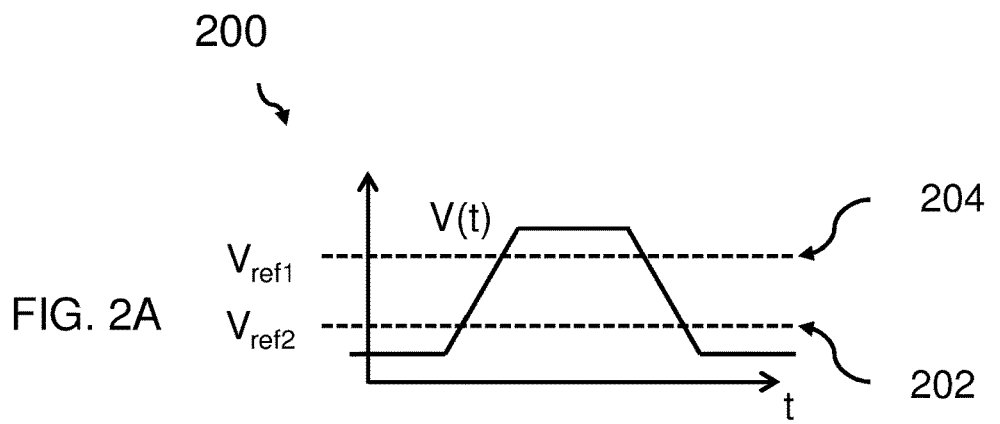
FIGS. 2A, 2B, 2C, 2D show a signal form at different points of the circuit of FIG. 1.

FIG. 2A, 2B, 2C, 2D show signal forms 200 at different points of the circuit of FIG. 1. FIG. 2A shows the incoming digital signal 102 with non-ideal rising and falling edges. Basically, the incoming signal 102 has a nearly trapezoid form. Additionally, voltage levels Vref1 and Vref2 are shown defining the function of the window detector 104.

Figure 2B:
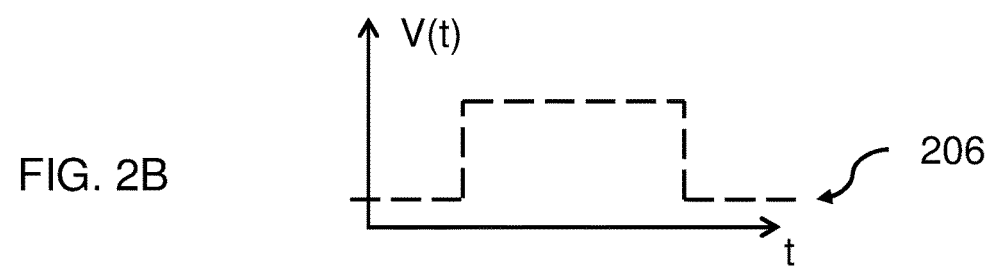
Figure 2C:
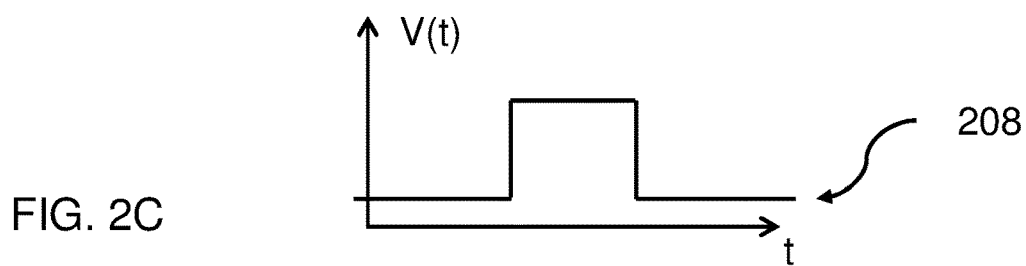
Figure 2D:
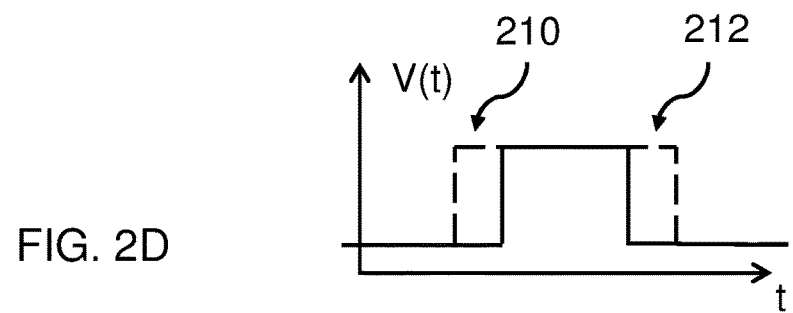

Consequently, FIG. 2B shows the output signal 206 of comparator 108 and FIG. 2C shows the output signal 208 of comparator 106. In FIG. 2D, the two output signals 206, 208 are shown in overlapping form showing the rising edge pulse width 210 and the falling edge pulse width 212. Ideally, the difference between the two pulse widths 210 and 212 should be pretty close to zero in order to generate an optimal clock signal (or any other signal). The time-difference-to-value circuitry is instrumental in minimizing the two pulse widths 210 and 212.

Figure 3:
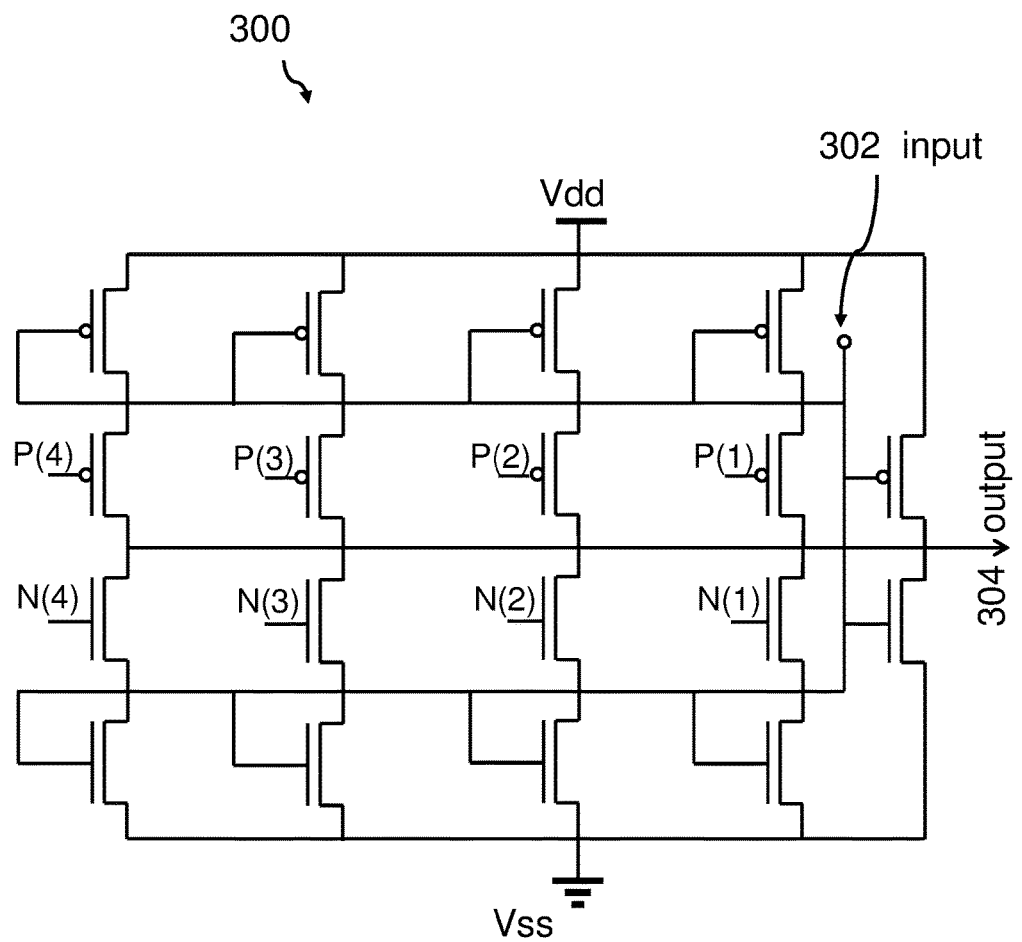
FIG. 3 shows a block diagram of an embodiment of a 4-bit programmable delay line.

FIG. 3 shows a block diagram 300 of an embodiment of a 4-bit programmable delay line with 16 possible settings. The minimum delay is at setting "0001" and the maximum delay is at "0000" in the Gray code. The circuit has a minimum delay—e.g., 2.5 to 3 ps in a 14 nm technology—allowing relatively precise adoptions of the delay. However, an inherent delay (about 40 ns in 14 nm technology) may not have any impact because of the application on both signals (rising edge, falling edge). It may be noted that the settings of both programmable delay lines (110, 112 of FIG. 1) may be the same at the beginning of the adjustment process. The maximum skew that may be detected is the maximum adjustable range of the programmable delay lines. In the here shown case, it is 16 times the value of ProgDelayStepmin which is identical to the basic internal delay.

The input lines P(1), P(2), P(3), P(4) are PMOS input values of a 4-bit Gray code counter; whereas the input lines N(1), N(2), N(3), N(4) are related to NMOS input values of the 4-bit Gray code counter. These second input signals may be negated by a related inverter (not shown). Thus, Ni=¬Pi, i=1 . . . 4. The input 302 may be connected to one of the two comparators 106, 108. The respective output line of the programmable delay line 304 is connected to one of the two branches of the edge detection circuit 116.

Figure 4:
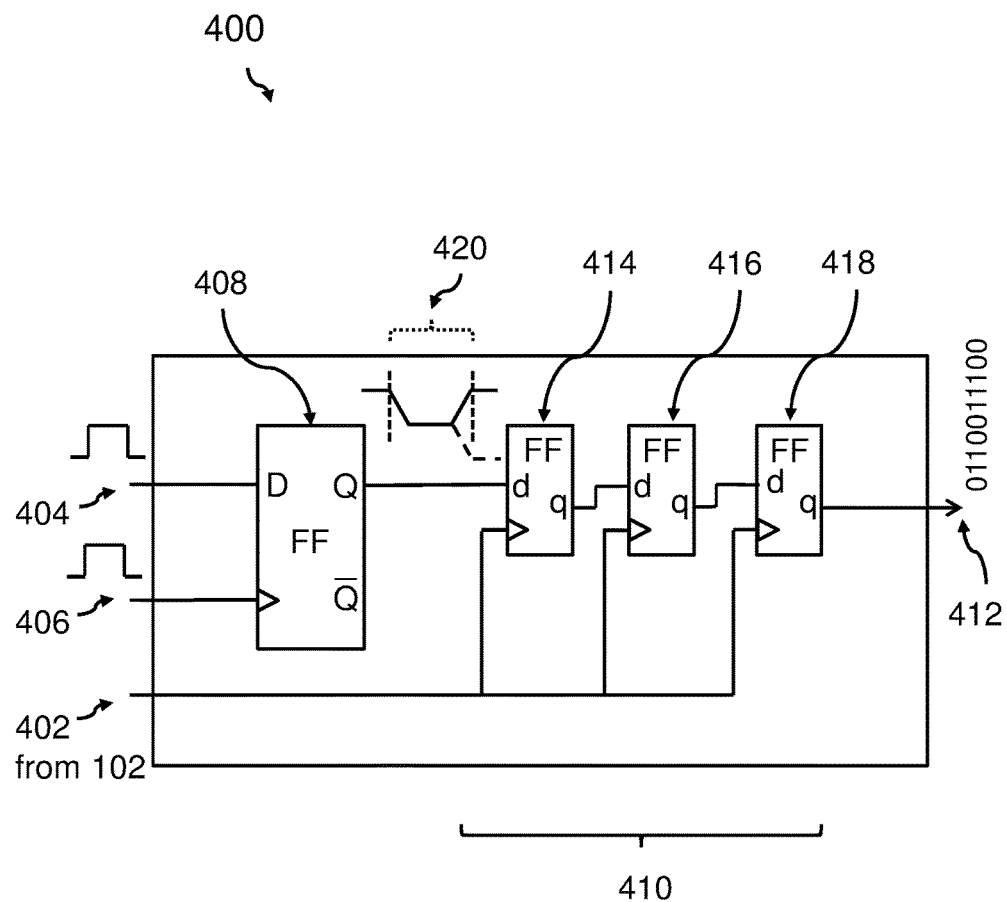
FIG. 4 shows a block diagram of an embodiment of a phase detector.

FIG. 4 shows a block diagram 400 of an embodiment of the phase detector 118, also denotable as a skew sensor. The control clock input 402 may be connected to the generated clock signal by the DUT (compare FIG. 1, 102). The two input signals 404, 406 may be attached to the output lines of the edge detector 116. In an ideal case—optimal waveform of the digital signal 102—the two incoming 404, 406 may put the D flip-flop in a metastable status, in particular, if measured over time.

Thus, the core element of the phase detector is a negative edge-triggered D flip-flop which detects the phasing of the two input signals 404, 406. The synchronizer stage 410 connected to the D flip-flop 408 output prevents a propagation of a metastable signal into the control logic. The phase detector will operate in a metastable state if zero skew is reached. Therefore, there are three synchronizer flip-flops 414, 416, 418 in a sequence that are clocked with the control clock 402, which is the clock for the control circuit 114. This makes sure that the sense output 412 is stable and in synch with the receiving logic. A logic value of "1" at the sense output 412 means that the edge of the input signal 406 arrives before the edge of the input signal 404. A logical value "0" at the sense output 412 means that the edge of input signal 404 arrives before the edge of the input signal 406.

The output of the flip-flop 408 can be metastable when the data and clock inputs change virtually at the same time. Because the making the two clock edges occurring at the same time is the main goal for the skew adjustment, the flip-flop 408 is operating in the metastable state almost all the time, as shown by the diagram 420. So, there needs to be a method to deal with that which still produces useful phase detector results. FIG. 4 shows that when the phase detector flip-flop 408 output is metastable, the sense output 412 will produce a string of "0" and "1" values that are changing randomly. Therefore, the control logic watches the sense output 412 for a certain number of cycles and counts the number of "1"s it finds during that time. Based upon the result, it decides about the state of the input signals 404, 406. If a metastable state is detected, then no adjustment to the programmable delay lines is made any longer.

Figure 5:
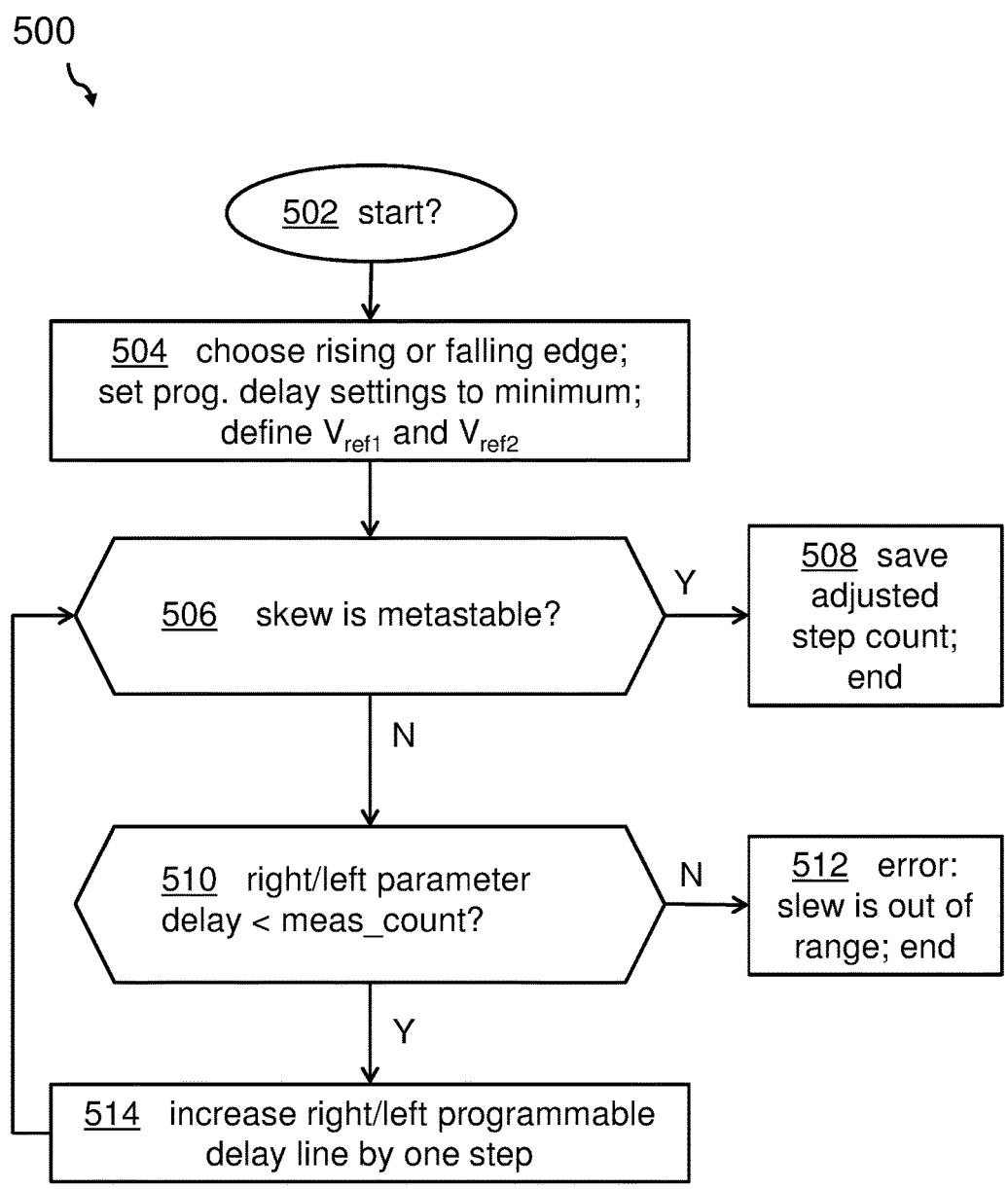
FIG. 5 shows an embodiment of a block diagram of a flowchart of the method for operating a circuit for measuring a transition time of a digital signal.

FIG. 5 shows an embodiment of a block diagram of a flowchart of the method 500 for operating a circuit for measuring a transition time of a digital signal. The method described here relates mainly to the internal function of the control circuit. After the start 502, some parameters have to be defined. At first, a decision of which edge should be measured has to be made. Secondly, a count of measurement (meas_count) has to be defined in the settings—in particular, the delays of the two programmable delay lines (110, 112 of FIG. 1) are set to a minimum. Thirdly, both reference voltages Vref1 and Vref2 are defined. For classical definitions of transition time with 10% to 90% of the voltage high value (mostly Vdd), one may choose, e.g., Vref1=0.9Vdd and Vref2=0.1Vdd. All of these activities are performed at step 504.

The skew sensor detects the skew between the signal from both comparator 106, 108 outputs and the settings of the related programmable delay line is increased (step 514) until the sensor detects Zero skew (metastability). This is performed by the loop comprising the steps 514, 506, 510. Finally, the count of adjusted steps is stored with the adjusted voltage reference pair Vref1, Vref2, step 508. If during the adjustment the number of meas_count is reached (step 512), then this happens, the slew is out of range and not adjustable.

The following table shows examples of received sense values that explain the described sensor interpretation by the control circuit. It may be assumed that 10 sensor output values are considered:

| received sense of values | number of "1"s | resulting sensor interpretation |
| --- | --- | --- |
| 0000000000 | 0 | signal 1 is early |
| 1111111111 | 10 | signal 1 is late |
| 0011011100 | 5 | metastability - both signals are in circuit |

In the last example in the table, 5 out of 10 phase detector oreutputs are at 1-state. Consequently, the remaining 5 out of 10 phase detector outputs are at 0-state. Hence, it is concluded that the related pulse width 210 or 212 is close enough to zero (below a threshold).

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-RAY), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for operating a circuit for measuring a transition time of a digital signal, said method comprising
choosing a rising or a falling edge of said digital signal,
setting a lower programmable delay value and an upper programmable delay value to a minimum value each,
define a first reference voltage and a second reference voltage characterizing said transition time of said digital signal,
determining whether a skew sensor is metastable and, on a positive outcome of said determination, save an adjusted step count of said upper and lower programmable delay value
in case of a negative outcome of said determination, selecting either said upper or said lower programmable delay value to be decreased or increased, respectively, before returning to said step of determining whether said skew sensor is metastable.

2. The method according to claim 1, wherein said determination whether said skew sensor is metastable has a positive outcome if a predefined percentage value of cycles has another value than a predetermined logical value.

* * * * *